United States Patent [19]

Donnally, Jr.

[11] 4,205,283
[45] May 27, 1980

[54] SIGNAL DELAY SYSTEM

[75] Inventor: William Donnally, Jr., Mine Hill, N.J.

[73] Assignee: The United States of America as represented by the Secretary of the Army, Washington, D.C.

[21] Appl. No.: 949,586

[22] Filed: Oct. 10, 1978

[51] Int. Cl.² .................. H03H 7/28; H03H 7/30; H03K 5/159; G11C 19/28
[52] U.S. Cl. ..................... 333/165; 307/221 D; 333/166; 333/173
[58] Field of Search .................. 333/165, 166, 173; 357/24; 364/824, 825, 862; 307/221 R, 221 C, 221 D

[56] References Cited

U.S. PATENT DOCUMENTS

| | | | |
|---|---|---|---|
| 3,402,355 | 9/1968 | Hannan et al. | 307/221 D X |
| 3,787,852 | 1/1974 | Puckette et al. | 307/221 D X |
| 4,084,107 | 4/1978 | Ohba et al. | 307/221 D |
| 4,145,676 | 3/1979 | Benoit-Gonin et al. | 333/165 |

Primary Examiner—Alfred E. Smith
Assistant Examiner—Marvin Nussbaum
Attorney, Agent, or Firm—Nathan Edelberg; Robert P. Gibson; Max Yarmovsky

[57] ABSTRACT

An analog signal is processed through a lowpass filter and then regularly sampled at different sample times by a plurality of charge coupled devices. The outputs of the charge coupled devices are then summed and applied to a second lowpass filter which acts to produce a reconstructed and delayed version of the original analog signal. With this arrangement the time delay associated with each charge cell of the charge coupled devices is a whole number multiple of the effective sampling period of the system, and significant decreases in charge transfer distortion are achieved.

5 Claims, 6 Drawing Figures

SIGNAL DELAY SYSTEM

GOVERNMENTAL INTEREST

The invention described herein may be manufactured, used and licensed by or for the government for governmental purposes without the payment to me of any royalties thereon.

BACKGROUND OF THE INVENTION

In a variety of instrumentation applications, including acoustics technology and general audio frequency signal processing, it is necessary to delay wideband analog information without introducing excessive distortion of the signal waveform. Typically, the longer the delay needed the higher becomes the complexity and cost of the network used to produce the delay.

One approach commonly used for obtaining short duration delays involves the employment of lumped or distributed constant fixed delay lines. Such lines are generally only practically useful for producing delays of the order of a few microseconds. When very long delays are attempted with such lines, the signal waveform tends to become unacceptably distorted.

A well-known complex and costly electronic approach to obtaining longer delays involves the use of analog to digital converters to sample and digitize the analog information. Digital serial shift registers are then employed to delay the digital samples, and finally a digital to analog converter is used to reconstruct an acceptable delayed version of the original analog signal. The cost of the digital equipment necessary for this approach can be prohibitive in many applications.

Another known method for signal delaying used commonly in the broadcast and recording industry involves the use of electromechanical delay techniques. However, the mechanical size and weight of the devices employed do not lend themselves to being useful in many critical instrumentation application.

In recent years an electronic element known as a charge coupled device (CCD) has been developed. These CCD devices are comprised of a plurality of series connected charge storage cells. The device functions in the discrete-time domain by storing samples of an input signal as packets of charge in an analog memory. The samples of charge are then transferred from stage to stage across the chip under the control of a sequence of clock pulses. The charge carrier movement is due to voltage differences between adjacent charge storing wells that serially transfer or couple the charge in one cell to an adjacent cell. In physical terms, a piece of crystalline solution coated with a thin insulating layer of $S_iO_2$ forms the CCD; and on top of the insulation layer a series of gates are deposited. The silicon and gate layer form two conductive elements separated by the $S_iO_2$ insulating layer. The charge in this capacitor-like structure is contained in a charge well that forms underneath the electrode in the silicon. By applying suitably timed clock pulses to the overlying clock lines on the CCD structure, sampled information (in the form of stored charge packets) is caused to be serially shifted along from cell to cell. The delay which a given charge packet experiences before being shifted to the next cell is determined by the frequency of the above-mentioned clock pulses. A CCD is capable of performing both the functions of sampling and delaying with a minimum of ancillary circuitry, thus making it a practical and cost effective alternative for use in many instrumentation applications. CCD's have the advantage of very low power consumption, high speed, small size and weight, and high density of charge storing elements. Suitable electronic ancillary components are commercially available so that hybrid electronic test packages employing the CCD's can be constructed in a manner such that the packages have relatively small size and weight.

In order to employ the CCD as a signal sampling and delaying means, it is necessary (according to the well-known Sampling Theorem) that the signal be sampled at a rate corresponding to at least twice the frequency of its highest significant frequency component. Thus, by directly using a CCD (or a series connection of CCD's) for sampling and delaying application, the delay attainable by a charge packet stored in a given cell is limited by the frequency content of the signal being sampled. Therefore, for a broad bandwidth signal to be sampled, it may be necessary to cascade several charge coupled devices together in order to obtain the desired delay. This dependence of the storage cell delay time upon the bandwidth of the analog signal being sampled is undesirable since it severely limits the design flexibility of such systems.

Consider for example the problem of delaying a band limited signal such as that shown in FIG. 1 for a time interval of $\tau = 40$ ms. If the highest significant frequency component of the band limited signal is $f_c = 20$ KHz, then it would be necessary to sample this signal at a rate of at least 40 KHz. Using typical off-the-shelf CCD devices having independent sections of 512 serially connected charge coupled cells, a minimum of 1600 cells would be required to attain the desired delay. Thus four serially connected sections using a sampling rate of 51.2 KHz would be necessary in a practical realization. Such extensive cascading of charge coupled devices is not desirable since appreciable difficulty is then experienced in adjusting the bias and gain levels of the devices and serious distortions due to charge transfer inefficiency tend to occur. Thus it is seen that the prior art practice of using cascaded charge coupled devices and employing a charge cell delay time which is determined by the bandwidth of the analog signal being delayed (as depicted in FIGS. 3 & 4) is not an altogether satisfactory approach.

It is therefore an object of the instant invention to provide a circuit arrangement having more versatility, more design flexibility, and resulting in a decreased distortion level of the analog signal being delayed.

SUMMARY OF THE INVENTION

In accordance with the invention, a band-limited input signal desired to be delayed is simultaneously applied to the input terminals of a plurality of charge coupled devices, each of which devices regularly samples and delays the applied signal in a sequence which is determined by regular clock pulses applied to the clock inputs of the devices. A clock pulse generator is provided for regularly pulsing the charge coupled devices at a predetermined frequency and in a predetermined sequence. The output signals of the charge coupled devices are then applied to a summer and a low pass filter which substantially reconstructs the input analog signal. Using this arrangement, the predetermined frequency of the clock pulses determines the time delay obtained by each individual charge cell in the charge coupled devices, but the effective sampling frequency of the system is equal to $N \times$ clock rate (where N is a whole number equal to the number of separate charge coupled devices used to individually sample the filtered analog waveform).

The arrangement of the instant invention thus provides a designer with an additional degree of flexibility which allows for a minimization of the effects of charge coupled device charge transfer distortion by minimizing the number of required cascaded stages of charge coupled devices. As such, the invention constitutes a significant new improvement in the signal delay art. A significant, useful feature of the invention comprises its implementation with a clock frequency only slightly higher than the cut-off frequency of the low pass filters employed so that a maximum time delay per charged cell will be realized without introducing clock frequency noise into the pass band of the analog signal being delayed. These and other desirable features of the instant invention will become more readily apparent upon a reading of the detailed description which follows.

DETAILED DESCRIPTION

Figure 1:
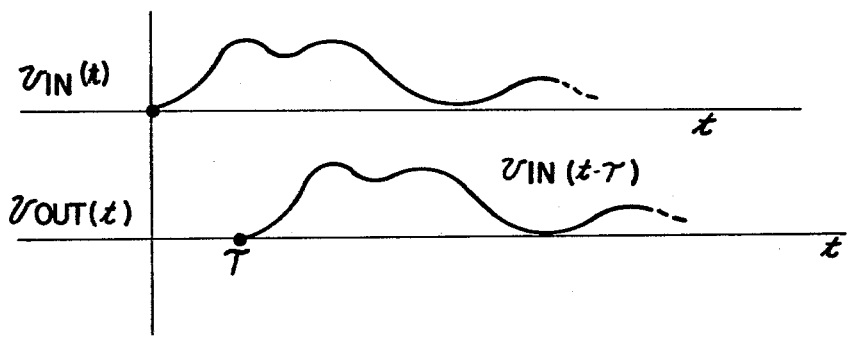
FIG. 1 shows a typical analog signal and an ideal delayed version of that signal delayed by a time $t = \tau$.

FIG. 1 shows a typical analog signal waveform that might be found in a variety of instrumentation applications including acoustics technology and general audio frequency signal processing. Also shown in an ideal delayed version of the same signal delayed by a time $t = \tau$.

Figure 2:
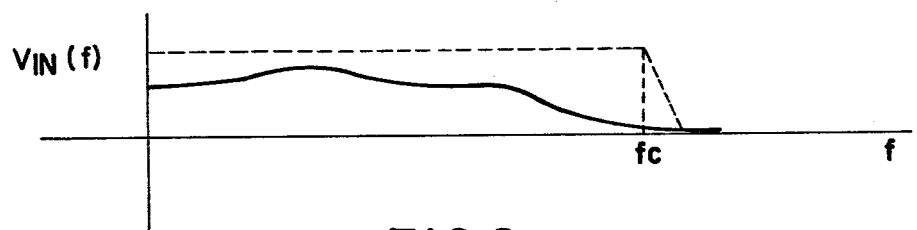
FIG. 2 shows a frequency domain characterization of the band-limited analog signal of FIG. 1 along with a representation of the characteristic of a low pass filter suitable for passing such a signal.

With such applications it is oftentimes desired to achieve a reasonably undistorted facsimile of an ideal delayed waveform with practically realizable electronic circuits. Such analog waveforms are typically band limited signals which only have significant frequency components below a particular frequency. A frequency spectrum characteristic curve for such a band limited signal is shown in FIG. 2. The dashed lines shown in FIG. 2 portray the asymptotes of a low pass filter with a frequency cut-off point $f_c$ which would pass the shown band limited signal with no significant distortion of the signal.

Figure 3:
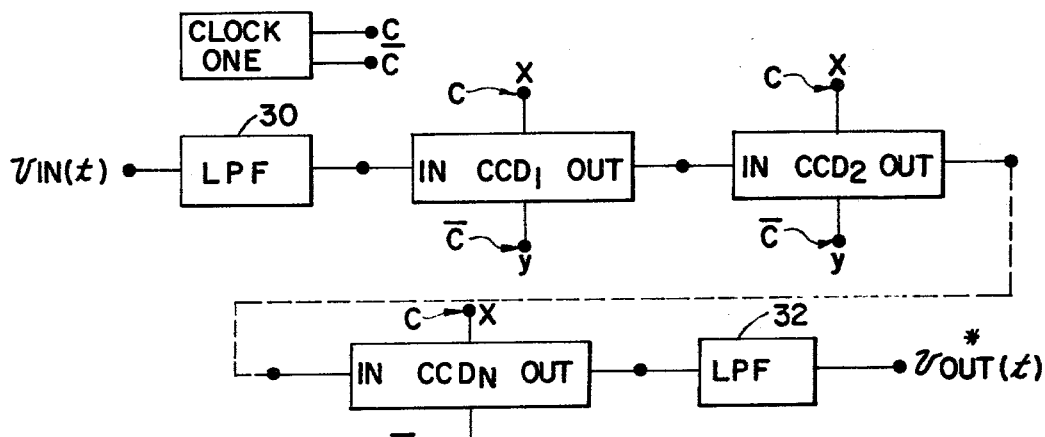
FIG. 3 shows a prior art technique for delaying an analog signal using a cascaded connection of charge coupled devices.

As indicated above in the Background of the Invention, a useful approach already known for obtaining relatively long time delays involves the employment of charge coupled devices as signal samplers and as sample delayers in a hybrid analog/sampled data system. Such a prior art system is shown in FIG. 3. The charge coupled devices in that system (i.e. $CCD_1$ through $CCD_n$) are designed such that each CCD samples a signal applied to its "IN" terminal at the time when a negative-going clock signal is applied to the CCD "x" input and a complementary positive-going clock signal is applied to the CCD "y" input. Each charge cell of the CCD includes a capacitor with a switching transistor connected on each side thereof, the first transistor switch being for charging the capacitor, the second transistor switch for discharging the capacitor and transferring the charge to the next charge cell. These transistor switches open and close in sequence according to the DC levels of the complementary clock signals applied to the "x" and "y" inputs. Thus, packets of charge are transferred from cell to cell, with the charge storage time in each cell being determined by the period of the clock signal. (A detailed equivalent circuit diagram and description thereof for a preferred CCD for use with the invention can be found in the SAD-1024A Specification Sheet available from the RETICON Corporation, 910 Benicia Avenue, Sunnyvale, Calif. 94086).

Figure 4:
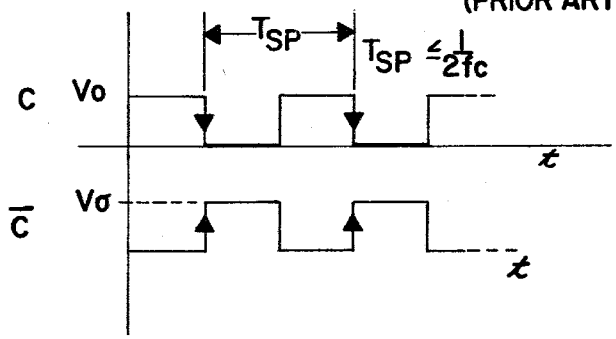
FIG. 4 shows the clock pulse waveforms necessary for operating the prior art circuit of FIG. 3.

With the clock signals C and $\overline{C}$ (shown in FIG. 4) applied to the circuit of FIG. 3, the output of low pass filter 30 is sampled at the input terminal of $CCD_1$ at a sampling frequency equal to the frequency of the clock pulses C and $\overline{C}$. In accordance with the well-known Sampling Theorem, this sampling frequency must be at least twice the frequency of the highest significant frequency component of the sampled analog signal. Thus for the signal of FIGS. 1 and 2, the clock frequency for the system of FIG. 3 must be at least twice $f_c$. With this arrangement the clock frequency for determining the amount of delay per charge cell in the CCD's is the same as the effective sampling frequency. Thus for a given band-limited signal the only way to increase the signal delay is to cascade additional CCD's as shown in FIG. 3. The analog signal is then substantially reconstructed by output low pass filter 32.

Figure 5:
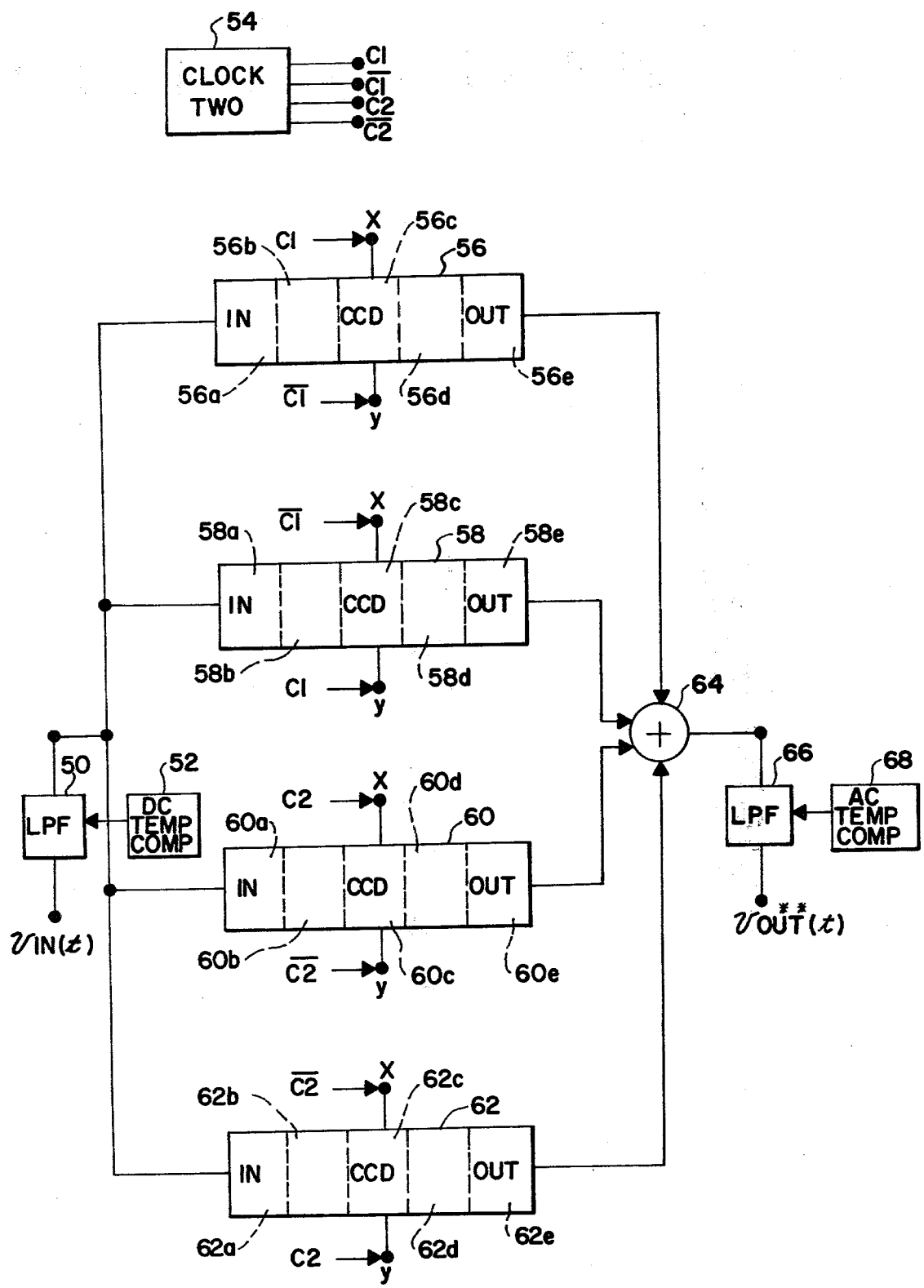
FIG. 5 shows an implementation of the instant invention in which the filtered analog input signal is separately sampled by a plurality of parallel connected charge coupled devices with different clock inputs.

Referring now to FIG. 5, depicted therein is a preferred embodiment of the instant invention. The low pass filter 50 is preferably a DC coupled RC active filter, the DC output level of which is automatically adjusted by DC temperature compensator 52 to compensate for the DC level shifts of the CCD's as a function of temperature. This output DC level is adjusted to provide the proper DC bias for operation of the CCD's 56-62. The low pass filter 50 serves as an anti-aliasing filter for the band-limited input signal $v_{IN}(t)$ to prevent the sampling of any extraneous signals outside the band of the input signal.

Figure 6:
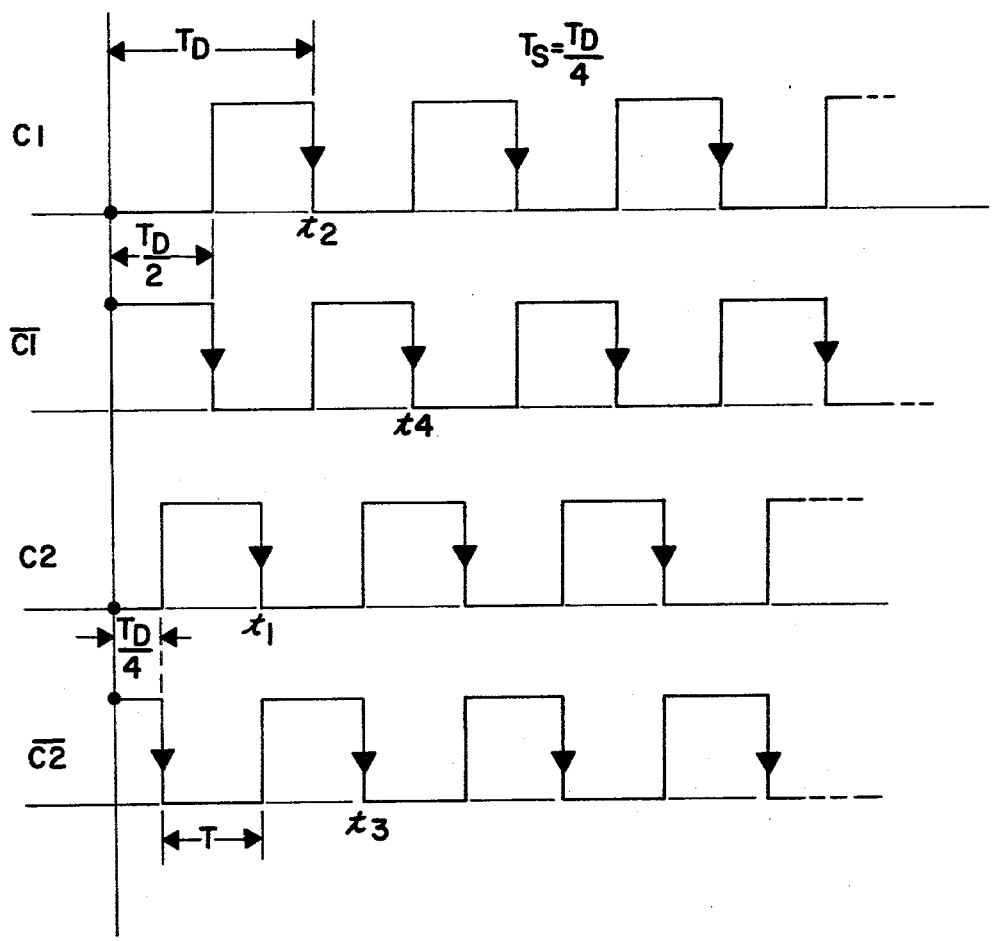
FIG. 6 shows a suitable synchronization of clock pulses for operation of the embodiment of FIG. 5.

The CCD's 56-62 sample the output signal of filter 50 at regular time intervals determined by the clock signals C1, $\overline{C1}$, C2, and $\overline{C2}$ of clock 54. The synchronization of these clock signals is shown in FIG. 6. The four signals shown have the same frequency (at least twice the cut-off frequency of the low pass filter 50) but they are staggered at 90 degree intervals. This set of complementary clock pulses is applied to the "x" and "y" clock inputs of CCD's 56-62 as shown in FIG. 5. The CCD's 56-62 are thus caused to sample the low pass filter 50 output signal at staggered time instants $t_1$-$t_4$ when the negative going transistors occur at the respective "x" clock inputs such that the effective sampling frequency is four times the fundamental clock frequency (i.e. $4/T_D$). The time delay experienced by a sample stored in a given charge cell of any of these CCD's remains equal, however, to the period of the fundamental clock frequency (i.e. $T_D$).

The circuit configuration of the instant invention thus provides a designer with an additional degree of flexibility since by paralleling a group of CCD's in the manner shown in FIG. 5, the effective sampling frequency of the system may conveniently be set at a rate higher than the fundamental clock frequency which determines the charge cell delay time.

The CCD's 56-62 could of course be series connections of sections (e.g., 52a-e-62a-e) of a predetermined number of cascaded charge cells. A preferred version of the CCD's shown is thus the Reticon type SAD-1024 which comprises two independent sections of 512 serially connected charge coupled cells. The CCD's 56-62 could thus be one or more of these independent sections cascaded to provide a desired amount of time delay.

The sample data output signals of CCD's 56-62 are combined by summer 64, and their combination is applied to low pass filter 66. Filter 66 has a frequency characteristic substantially the same as filter 50, and is also preferably constructed as a RC active filter having an AC gain temperature compensator 68 applied thereto to balance out any AC gain variations of the CCD's due to variations in temperature. Low pass filter 66 effectively reconstructs a delayed version $v_{OUT}^{}(t)$ of the original input signal $v_{IN}(t)$, while filtering out the fundamental and harmonic components of the clock frequency extant at the output of the summer 64**. Thus it is seen that for the system of the invention to function properly, the fundamental clock frequency should be picked to be higher than the cut-off frequency of the low pass filters employed as anti-aliasing and reconstruction filters. By using an arrangement according to the invention such as shown in FIG. 5, it is possible for a designer to minimize the effects of charge transfer distortion due to extensive cascading of charge coupled devices. A practical example of such a design will now be given.

Consider the problem of delaying a band-limited signal with its highest frequency signal component occurring at f=20 KHz for a desired delay interval of 40 milliseconds. It will be assumed for the purposes of this example that the charge coupled devices being employed have independent sections of five hundred and twelve charge coupled cells each. For the subject signal, a sampling frequency $f_s$ of not less than 40 KHz is required. $f_x=50$ KHz will therefore be used for this example. If the delay desired were to be achieved by a simple cascading of charge coupled devices, as shown in FIG. 3, it would be necessary to employ 2000 charge coupled cells in series. This would required the cascading of four of the above-mentioned charge coupled device sections. If, however, a parallel connection of two charge coupled device paths were used to delay the signal using the arrangement of the instant invention, it would only be necessary to cascade two of the above-mentioned charge coupled device sections per parallel path. If complementary clock signals such as C1 and $\overline{C1}$ shown in FIG. 6 were used, a 25 KHz clock frequency would be required to accomplish the desired effective sampling rate. Thus by using the configuration of the instant invention for this example, the number of series-connected charge coupled cells employed per delay path is halved, resulting in a significant decrease (i.e. approximately a 50 percent decrease) in the expected distortion of the delayed signal due to the effects of charge transfer inefficiency. The effective sampling frequency is furthermore advantageously made double the clock frequency.

The number of parallel paths to be employed, along with the desired clock frequency and sampling frequency, can be conveniently selected by the designer using the arrangement of the instant invention to provide substantially optimum solutions to a large variety of analog signal delay problems.

The invention is not restricted to the particular embodiment described above but rather is limited only by the scope of the following claims.

I claim:
1. A system for delaying a first signal comprising:
   a plurality of charge coupled devices, each being responsive to controlling clock pulses, for sampling said first signal;
   a summer responsive to the output signals of each of said charge coupled devices;
   an output low pass filter responsive to the output signal of said summer for reconstructing said summer output signal into a second signal which is substantially a delayed version of said first signal; and includes said output low pass filter which is temperature compensated to substantially neutralize the effect of temperature variations on the AC gain of said charge coupled devices; and
   a clock pulse generator having a plurality of outputs connected to the clock inputs of said plurality of charge coupled devices whereby each of said charge coupled devices are caused to regularly sample said first signal at sampling times different from and interleaved with the sampling times of each of the other charge coupled devices.

2. The system of claim 1, including an input low-pass filter for filtering said first signal and applying the resulting filtered first signal to the input terminals of said plurality of charge coupled devices, wherein said input low pass filter is DC coupled to said charge coupled devices and is temperature compensated to substantially neutralize the effects of temperature compensated to substantially neutralized the effects of temperature upon the DC bias levels of said charge coupled devices connected thereto.

3. The system of claim 1 wherein said charge coupled devices sample said first signal at evenly spaced sampling times.

4. The system of claim 1, wherein said first signal is substantially a frequency band-limited signal and wherein the passband of said output low pass filter is substantially equal to the limited frequency band of said first signal.

5. The system of claim 1, wherein said charge coupled devices comprise a series connection of one or more sections containing a cascaded group of charge coupled cells in each section.

* * * * *